United States Patent

Hikata et al.

[11] Patent Number: 5,807,808
[45] Date of Patent: Sep. 15, 1998

[54] METHOD OF PREPARING BI OXIDE SUPERCONDUCTING WIRE

[75] Inventors: Takeshi Hikata; Kenichi Sato, both of Osaka, Japan

[73] Assignee: Sumitomo Electric Industries, Ltd., Japan

[21] Appl. No.: 400,624

[22] Filed: Mar. 6, 1995

Related U.S. Application Data

[63] Continuation of Ser. No. 83,858, Jun. 28, 1993, abandoned, which is a continuation of Ser. No. 863,322, Apr. 1, 1992, abandoned, which is a continuation of Ser. No. 467,691, Jan. 19, 1990, abandoned.

[30] Foreign Application Priority Data

Jan. 21, 1989 [JP] Japan ..................................... 1-12592
Jun. 27, 1989 [JP] Japan ..................................... 1-164509

[51] Int. Cl.⁶ .................................................. H01L 39/24
[52] U.S. Cl. ........................... 505/433; 29/599; 241/20; 505/492; 505/501
[58] Field of Search .................... 505/492, 501, 505/705, 430, 433; 241/1, 20; 29/599

[56] References Cited

U.S. PATENT DOCUMENTS

| | | | |
|---|---|---|---|
| 4,697,744 | 10/1987 | Wada et al. | 241/20 |
| 4,721,256 | 1/1988 | Lyman | 241/1 |
| 4,980,964 | 1/1991 | Boeke | 29/599 |

FOREIGN PATENT DOCUMENTS 0292385  5/1988  European Pat. Off. .

OTHER PUBLICATIONS

*Metallurgy*, Johnson et al., 1977, p. 345.

Hikata T., et al., "Ag-Sheathed Bi-Ph-Sr-Ca-Cu-O Superconducting Wires with High Critical Density," Japanese Journal of Applied Physics, vol. 28, No. 1, Jan., 1989, pp. L82–84.

Sekine, H. et al., "Studies on the Rare Earth Oxide Superconductors Fabricated by Sintering," IEEE, vol. 25, No. 2, Mar. 1989, pp. 2164–2167.

Primary Examiner—Joseph M. Gorski
Attorney, Agent, or Firm—Pennie & Edmonds LLP

[57] ABSTRACT

In order to obtain a Bi—Sr—Ca—Cu—O or Bi—Pb—Sr—Ca—Cu—O oxide superconducting wire, raw material powder is pulverized to remove particles of non-superconducting phases having large particle sizes based on difference in particle size, and thereafter the raw material powder is covered with a sheath of silver or silver alloy, so that the sheath is subjected to plastic working and the raw material powder covered with the sheath is sintered.

8 Claims, 2 Drawing Sheets

1

METHOD OF PREPARING BI OXIDE SUPERCONDUCTING WIRE

The application is a continuation of U.S. application Ser. No. 08/083,858, filed on Jun. 28, 1993 and now abandoned, which is a continuation of U.S. application Ser. No. 08/863, 322, filed on Apr. 1, 1992 and now abandoned, which in turn is a continuation of U.S. application Ser. No. 07/467,691, filed on Jan. 19, 1990 and now abandoned.

BACKGROUND OF THE INVENTION

1. Field of the Invention

The present invention relates to a method of producing a superconducting wire, and more particularly, it relates to an improvement for attaining increase in critical current density in a Bi—Sr—Ca—Cu—O or Bi—Pb—Sr—Ca—Cu—O oxide superconducting wire.

2. Description of the Background Art

A specific material exhibits diamagnetism under a superconducting phenomenon such that no voltage potential difference is developed although a finite stationary current flows in its interior.

This superconducting phenomenon is applied to an extremely wide range of fields such as that of electric power including MHD power generation, power transmission and power storage and that of transportation including a magnetic levitation train and an electromagnetically propelled ship. Further, a supersensitive sensor for a magnetic field, a high frequency, radiation rays or the like using the superconducting phenomenon is applied to the fields of measurement including nuclear magnetic resonance (NMR), π-meson remedy and a high energy physical experimental apparatus, while the superconducting phenomenon is also expected in the field of electronics, which is represented by the Josephson device, as a technique which can not only reduce power consumption but implement an element of extremely high-speed operation.

Superconductivity was until recently only observed under a very low temperature. Even $Nb_3Ge$, which has been referred to as that having the highest critical temperature $T_c$ of superconductivity within conventional superconducting materials, has an extremely low critical temperature of 23.2K, and this value has been regarded as the limit critical temperature of superconductivity for a long period of time.

Therefore, a superconducting material has been generally cooled to a temperature below the aforementioned critical temperature with liquid helium which boils at 4.2K, in order to implement a superconducting phenomenon. However, such employment of liquid helium leads to technical and economic burdens due to cooling equipment including liquefaction equipment, to hinder implementation of the superconduction technique.

On the other hand, it has been recently reported that a composite oxide sintered body can exhibit superconductivity at a high critical temperature, and development of the superconducting technique is abruptly being prompted with a superconductor whose critical temperature is not very low. It has been reported and recognized that a Y—Ba—Cu—O material superconducts at 90K, and Bi—Sr—Ca—Cu—O and Bi—Pb—Sr—Ca—Cu—O materials superconduct at 110K, respectively. These superconductors enable employment of liquid nitrogen for cooling.

Liquid nitrogen is relatively easily obtainable at a low cost, and in fact, development of the superconductivity technique has been greatly advanced with discovery of a superconducting material which operates at the temperature of the liquid nitrogen.

In practice, however, it is necessary to attain not only a high critical temperature but current density of at least $10^3$ to $10^4$ A/cm² for a superconducting magnet, a wiring member for a device, a power cable or the like, for example. Although it is effective to use a Bi-based superconductor, or particularly a superconductor, such as a Bi—Pb—Ca—Cu—O superconductor, containing Bi which is partially replaced by Pb, the current density of such a Bi-based superconductor is 100 to 200 A/cm² at the most. In practice, it is necessary to attain current density of at least ten times.

As hereinabove described, a Bi-based oxide superconductor is watched with interest in a point that the same exhibits a higher critical temperature as compared with a Y—Ba—Cu oxide superconductor. Such a Bi-based oxide superconductor is generally produced by press-forming raw material powder and directly introducing the obtained compact into a heating furnace or the like for heat treatment. It is known that the Bi-based oxide superconductor produced in the aforementioned manner contains two types of phases including low-temperature superconducting phases having a critical temperature of about 80K and high-temperature superconducting phases having a critical temperature of about 110K.

According to a Bi—Pb—Sr—Ca—Cu oxide superconductor obtained by partially replacing Bi which is contained in a Bi—Sr—Ca—Cu oxide superconductor by Pb, the rate of high-temperature superconducting phases (110K phases) can be increased by controlling oxygen partial pressure within the atmosphere in the heating furnace for heat treatment, while a large amount of non-superconducting phases, such as $(Ca,Sr)_2PbO_x$, CuO and the like are generated. It is considered that such generation of the non-superconducting phases hinders attainment of high critical current density.

SUMMARY OF THE INVENTION

An object of the present invention is to provide a method of efficiently producing a superconducting wire which exhibits superconductivity at a temperature of at least 100K, by far exceeding the liquid nitrogen temperature, and which can increase critical current density.

Another object of the present invention is to provide a method of producing an oxide superconducting wire by thermally treating raw material powder, which can reduce the rate of non-superconducting phases or remove such non-superconducting phases.

The present invention is directed to a method of producing a Bi—Sr—Ca—Cu—O or Bi—Pb—Sr—Ca—Cu—O superconducting wire. In order to solve the aforementioned technical problem, the present invention comprises:

a. a step of preparing powder which is composed of $Bi_aPb_bSr_cCa_dCu_e$, where a+b:c:d:e=1.7 to 2.8:1.7 to 2.5:1.7 to 2.8:3, and oxygen, and subjected to heat treatment so as to obtain a superconductor which mainly has superconducting phases having a critical temperature of at least 100 K;

b. a step of covering the powder with a sheath of a metal or alloy which is unreactive with the superconductor at a temperature of not more than 900° C. and causes no reduction of the superconductor;

c. a step of plastically working the sheath which covers the superconductor; and d. a step of sintering the superconductor which is covered with the sheath.

According to a preferred embodiment of the present invention, the values in the formula expressing the composition of the powder are so selected that a is around 1.8, b is around 0.4, c is around 2 and d is around 2.2. Such composition is based on that having a critical temperature of 110K, which is generally known as a composition as based 2223.

According to the present invention, the sheath is preferably made of silver or silver alloy.

The plastic working step carried out in the present invention is adapted to provide desired configuration and dimensions to the superconductor to be obtained. In this case, the plastic working step may be carried out within any temperature range for cold working, warm working or hot working, while a well-known method such as wire drawing, swaging, rolling or press working is employed for the plastic working. Such a plastic working step may be carried out in a plurality of stages. Further, the sintering step may be carried out after the plastic working step is completed, or in an intermediate stage of the plastic working step at need.

According to the present invention, the powder which is covered with the sheath may contain non-superconductor powder having one-dimensional or two-dimensional crystal structure, i.e. needle-type or plate-type crystal structure, in addition to superconductor. The non-superconducting phase thus contained in the powder is preferably prepared from $(Ca,Sr)_2PbO_x$, $Sr_2Ca_2Cu_3O_x$ or the like.

It is preferable to pulverize the powder by ultrasonic waves, for example, to remove coarse particles from the non-superconducting phases before charging the powder in the sheath. In this case, the remaining powder is preferably not more than 0.5 $\mu$m, and more preferably, not more than 0.2 $\mu$m in particle size.

In more concrete terms, it is easy to cleave a Bi-based oxide superconductor for obtaining fine powder in units of submicrons, while powder of $(Ca,Sr)_2PbO_x$, CuO or the like for non-superconducting phases is hardly cloven and tends to provide coarse particles of at least 1 $\mu$m in diameter. Namely, it is easy to cause difference in particle size between the particles for generating superconducting phases and those for generating non-superconducting phases. Thus, it is possible to effectively remove the particles for generating non-superconducting phases from the raw material powder on the basis of such difference in particle size.

In order to remove the particles for generating non-superconducting phases on the basis of the aforementioned difference in particle size, it is possible to utilize difference in sedimentation velocity in a liquid, for example. In more concrete terms, the raw material powder is introduced into a liquid and sufficiently stirred, to disperse the powder within the liquid. When such a turbid liquid is left for a constant period, first precipitated are coarse particles for generating non-superconducting phases. After the particles for generating non-superconducting phases are entirely precipitated, the remaining particles for generating superconducting phases, which are still dispersed in the liquid, may be transferred to another vessel to evaporate the liquid. Thus, the particles for generating superconducting phases can be extracted. After the liquid containing the particles for generating superconducting phases is transferred to the other vessel, the particles for generating superconducting phases may be extracted to remove the supernatant before evaporating the liquid.

In the aforementioned method utilizing the difference in sedimentation velocity in a liquid, the liquid is preferably prepared from alcohol such as ethanol, methanol or the like, which is unreactive with the raw material powder during heat treatment and quickly evaporated.

According to the present invention, the powder is already exclusively or mainly composed of particles having a critical temperature of at least 100 K before the same is covered with the sheath. It has been experimentally confirmed that a superconductor obtained by charging such powder in a sheath and performing plastic working and sintering exhibits high critical current density while reduction in critical current density within a magnetic field is suppressed.

According to the present invention, the powder is covered with a sheath of a metal or alloy which is unreactive with the superconductor at a temperature of not more than 900° C. and causes no reduction of the superconductor. Thus, the superconductor is prevented from contamination with or diffusion of impurities, or the oxide superconductor is prevented from reduction. Silver or silver alloy satisfies this condition. Such silver or silver alloy can effectively serve as a stabilizer.

It has also been experimentally confirmed that, when the superconductor is sintered in an intermediate stage in addition to sintering in the final configuration or dimensions through plastic working, that is, when the plastic working step and the sintering step are alternately repeated a plurality of times, the critical current density can be improved while equivalently maintaining the critical temperature in particular, as compared with the case of sintering the superconductor only in the stage of the final dimensions or configuration.

According to the present invention, further, non-superconducting phases having one-dimensional or two-dimensional crystal structure, i.e. needle-type or plate-type crystal structure, are previously contained in the superconducting powder so that no reduction of critical current density is caused while the non-superconducting phases generate plate-type or needle-type non-superconducting phases for serving as pinning points in the obtained sintered body, thereby improving critical current density of the obtained superconductor within a magnetic field.

It is preferable to pulverize the powder, which is covered with the sheath, by ultrasonic wave energy, for example, to remove coarse particles from the non-superconducting phases and leave only particles of not more than 2 $\mu$m in size, for example. Such operation is adapted to enable extraction of only particles having a critical temperature of at least 100 K and fine non-superconducting phases having two-dimensional crystal structure, while removing coarse non-superconducting phases, which have been confirmed to be present in a Bi-based superconductor. Further, reactive bonding of the particles can be activated by reducing the particles in size to further improve the critical current density, while it is also possible to suppress reduction of the critical current density within a magnetic field.

When raw material powder is charged in a silver pipe, for example, and subjected to degressive working such as wire drawing in order to obtain an elongated superconducting wire rod, it is possible to effectively prevent disconnection which is caused by coarse particles of non-superconducting phases, since the powder substantially or absolutely contains no such coarse particles.

These and other objects, features, aspects and advantages of the present invention will become more apparent from the following detailed description of the present invention when taken in conjunction with the accompanying drawings.

DESCRIPTION OF THE PREFERRED EMBODIMENTS

Example 1

Oxide and carbonate powder materials of Bi, Pb, Sr, Ca and Cu were mixed in the ratios 1.8:0.4:2.0:2.3:3.0. This mixture was calcined once in the atmosphere at 800° C., pulverized and thereafter subjected to heat treatment in an atmosphere containing oxygen gas and nitrogen gas in the partial pressure ratio 1:12 at 845° C. for 100 hours. Then the mixture was pulverized in a mortar for 30 minutes, to prepare raw material powder.

Figure 1:
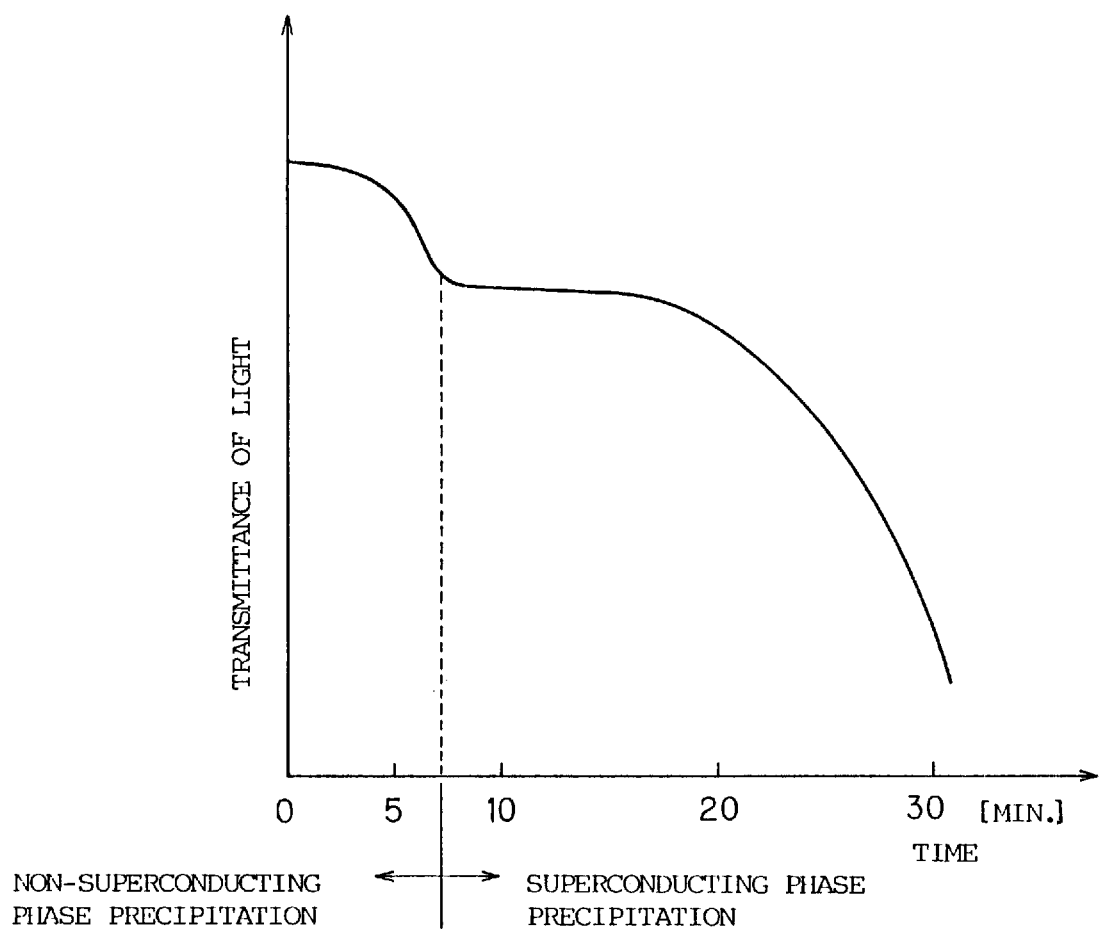
FIG. 1 illustrates time change in sedimentation of raw material dispersed in a liquid in relation to transmittance of light.

Then the raw material powder was introduced into ethanol and dispersed in the ethanol by sufficient stirring. Thereafter this ethanol was left. FIG. 1 shows the sedimentation velocity of the raw material powder with time change in transmittance of light through the ethanol. As understood from FIG. 1, the curve showing the change in transmittance of light has a point of inflection since the amount of the raw material powder dispersed in the ethanol was changed in two stages with time. In other words, it is understood that coarse particles of $(Ca,Sr)_2PbO_x$, CuO etc. for non-superconducting phases were initially precipitated while fine particles for generating superconducting phases started precipitation after a lapse of a prescribed period.

On the basis of the above recognition, raw material powder was dispersed in ethanol, which was left for 10 minutes. Then the ethanol was transferred to another vessel while leaving the precipitates intact. Through such operation, it was possible to remove particles of non-superconducting phases, which were left as the precipitates, from the ethanol transferred to the other vessel. The ethanol transferred to the other vessel still contained particles for generating superconducting phases, which were then extracted by evaporating the ethanol. Thus, it was possible to recover the powder for generating superconducting phases by about 100%.

Then, the powder for generating superconducting phases obtained in the aforementioned manner was charged in a silver pipe of 12 mm in outer diameter and 8 mm in inner diameter, subjected to wire drawing until its outer diameter was 0.65 mm, and thereafter rolled to obtain a tape-type wire rod of 0.2 mm in thickness. This tape-type wire rod was subjected to heat treatment at 845° C. for 50 hours, to sinter the powder for generating superconducting phases. Further, this tape-type wire rod was again rolled to have thickness of 0.1 mm, and then subjected to heat treatment at 845° C. for 50 hours. A superconducting wire rod thus obtained exhibited critical current density of 8000 to 10000 A/cm² in a state dipped in liquid nitrogen.

On the other hand, reference example was prepared through operation similar to the above without carrying out the step of removing particles for generating non-superconducting phases. A wire rod thus obtained exhibited critical current density of only 2000 to 3000 A/cm².

Thus, it is understood that high critical current density can be obtained according to the present invention. It is supposed that this is because superconducting phases are about 100%, and the superconducting phases can be prevented from cracks in the step of plastic working such as rolling by removing coarse particles for generating non-superconducting phases.

Example 2

Powder materials of $Bi_2O_3$, PbO, $SrCO_3$, $CaCO_3$ and CuO were mixed so that Bi, Pb, Sr, Ca and Cu were in the ratios 1.8:0.4:2:2.2:3, and sintered in the atmosphere at 800° C. Thereafter $O_2$ partial pressure was so adjusted that $O_2:N_2$ =1:12 to sinter the mixture at 845° C., thereby preparing powder containing only superconducting phases having a critical temperature of at least 100 K. Powder mixture equally containing $(Ca,Sr)_2PbO_x$ and $Sr_2Ca_2Cu_3O_x$ was mixed, in an amount equal to 5 wt% of the aforementioned powder containing only superconducting phases, into the powder of only superconducting phases.

The mixed powder was pulverized in alcohol with an ultrasonic homogenizer. It was possible to collect particles having arbitrary particle sizes by leaving the alcohol for a prescribed period and evaporating the same for extracting particles left therein since coarse particles are quickly precipitated in alcohol. Thus, the powder was classified into those of about 10 μm, about 5 μm, about 1 μm and about 0.5 μm in particle size.

Then such powder materials were charged in silver pipes respectively, and worked into wire rods through wire drawing and rolling. The wire rods were subjected to heat treatment at 845° C. for 50 hours, further rolled and thereafter sintered at 840° C for 50 hours.

The following Table shows critical current density values of the respective samples in liquid nitrogen under a zero magnetic field.

TABLE

| Particle Size (μm) | Critical Current Density (A/cm²) |
| --- | --- |
| 10 | 5 × 10³ |
| 5 | 8 × 10³ |
| 1 | 15 × 10³ |
| 0.5 | 25 × 10³ |

As understood from the above Table, the critical current density values were increased as the powder materials charged in the silver pipes were reduced in particle size.

Figure 2:
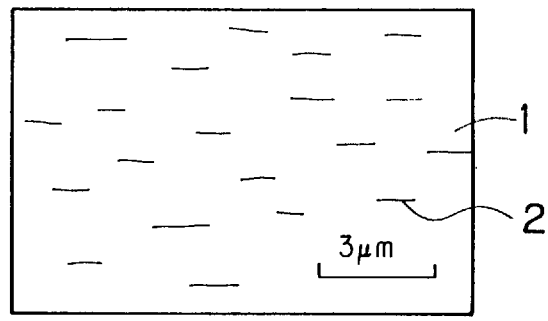
FIG. 2 is a sectional view showing a superconductor obtained according to Example of the present invention.

FIG. 2 shows the section, observed with a microscope, of a superconducting part in a superconducting wire rod which was prepared from the aforementioned powder material of 0.5 μm in particle size, which attained the highest critical current density. Referring to FIG. 2, it has been understood that a large number of plate-type or needle-type fine non-superconducting phases 2 of not more than 1 μm in thickness were dispersed in a superconducting phase 1.

Figure 3:
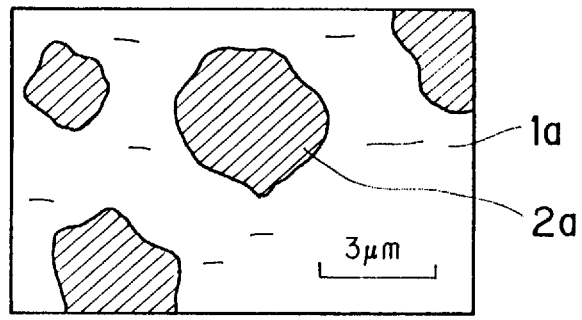
FIG. 3 is a sectional view showing a reference example relating to the Example shown in FIG. 2.

Reference example was prepared by similarly classifying powder, mainly composed of superconducting phases having a critical temperature of 80 K, to not more than 10 μm in particle size, charged in a silver pipe and thereafter subjected to operation similar to that of the above Example, to obtain a superconducting wire rod. This wire rod exhibited critical current density of only 3000 A/cm². FIG. 3 shows the section of a superconducting part of this wire rod. As shown in FIG. 3, granular non-superconducting phases 2a of several micrometers in size were left in a superconducting phase 1a. It is considered that the granular non-superconducting phases 2a blocked the superconducting current.

Figure 4:
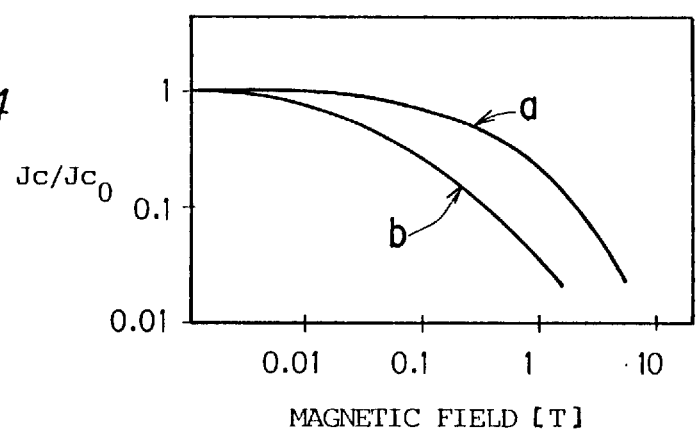
FIG. 4 illustrates field dependency of critical current density of a superconductor obtained by carrying out the present invention.

FIG. 4 shows field dependency of critical current density relating to the Example of the present invention. Referring to FIG. 4, the vertical axis represents the ratio of critical current density (Jc) under a magnetic field to critical current density ($Jc_0$) in a zero field. Symbol a denotes a sample of $Jc_0=25\times10^3$ A/cm$^2$, and symbol b denotes a sample of $Jc_0=5\times10^3$ A/cm$^2$. As understood from FIG. 4, the critical current density within a magnetic field was improved according to the present invention, and such characteristic was improved with reduction in particle size of the powder covered with a silver pipe, i.e., a sheath.

While the superconductor contains non-superconductor powder having one-dimensional or two-dimensional crystal structure such as $(Ca,Sr)_2PbO_x$ and $Sr_2Ca_2Cu_3O_x$ in the above description, it has been recognized that, even if no such non-superconductor powder is contained, high critical current density can be obtained with small reduction within a magnetic field by employing powder which is subjected to heat treatment so as to mainly generate superconducting phases having a critical temperature of at least 100 K.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of producing a superconducting wire comprising the steps of:

preparing a raw material powder comprising $Bi_aPb_bSr_cCa_dCu_e$, where the ratio of a+b:c:d:e is about 1.7 to 2.8:1.7 to 2.5:1.7 to 2.8:3, and oxygen;

heat treating said raw material powder thereby obtaining a superconductor powder having particles of a superconducting phase with a critical temperature of at least 100 K and particles of non-superconducting phases selected from the group consisting of $(Ca,Sr)_2PbO_x$ and $Sr_2Ca_2Cu_3O_x$; dispersing said superconductor powder in a liquid and precipitating therein said particles of non-superconducting phases without precipitating said particles of the superconducting phase, thereby separating said particles of the non-superconducting phases from said particles of the superconducting phase;

covering only said particles of the superconducting phase with a metalic sheath, said metalic sheath being unreactive with said particles of the superconducting phase at a temperature of not more than 900° C. and causing no reduction of superconductivity to said particles of the superconducting phase;

plastically working said sheath covering said particles of the superconducting phase; and sintering said particles of the superconducting phase covered with said sheath.

2. The method of producing a superconducting wire in accordance with claim 1, wherein said sheath is made of silver.

3. The method of producing a superconducting wire in accordance with claim 1, including repeating said plastically working step and said sintering step alternately a plurality of times.

4. The method of producing a superconducting wire in accordance with claim 1, including performing said sintering step after said step of plastically working has been completed.

5. The method of producing a superconducting wire in accordance with claim 1, wherein said particles of the non-superconducting phases have one-dimensional or two-dimensional crystal structure.

6. The method of producing a superconducting wire in accordance with claim 1, wherein said step of preparing said powder comprises a step of pulverizing said powder by ultrasonic waves.

7. The method of producing a superconducting wire in accordance with claim 1, wherein said superconductor powder has a particle size not more than 2 $\mu$m after said separating step.

8. The method of producing a superconducting wire in accordance with claim 1, wherein said sheath is made of silver alloy.

* * * * *